United States Patent [19]

Harder

[11] Patent Number: 4,977,683
[45] Date of Patent: Dec. 18, 1990

[54] IMAGE CONTROL BOARD

[75] Inventor: Willard J. Harder, Eden Prairie, Minn.

[73] Assignee: Ternes Register Systems, St. Paul, Minn.

[21] Appl. No.: 321,570

[22] Filed: Mar. 9, 1989

[51] Int. Cl.⁵ ............................................. G03B 27/20
[52] U.S. Cl. ...................................... 33/621; 33/623; 355/73; 355/76
[58] Field of Search ................. 33/621, 620, 619, 617, 33/615, 614, 613, 623; 355/75, 72, 76, 73, 91; 269/47

[56] References Cited

U.S. PATENT DOCUMENTS

| | | | |
|---|---|---|---|
| 2,238,106 | 4/1941 | Fleischer | 33/623 |
| 2,277,405 | 3/1942 | McKiernan | 33/616 |
| 2,776,594 | 1/1957 | Garity | 33/623 |
| 3,000,737 | 9/1961 | Barnhart | 33/615 |
| 3,160,096 | 12/1964 | Norton | 33/623 |
| 3,381,554 | 5/1968 | Ploch et al. | 33/623 |
| 3,400,630 | 9/1968 | Carlson | 355/75 |
| 3,572,228 | 3/1971 | Ternes | 33/623 |
| 3,591,284 | 7/1971 | Liebman | 33/616 |
| 3,751,817 | 8/1973 | Willis | 33/623 |
| 3,771,870 | 11/1973 | Taylor | 33/623 |
| 3,918,694 | 11/1975 | Laudick | 33/623 |
| 4,280,279 | 7/1981 | Grundfest | 33/613 |
| 4,332,089 | 6/1982 | Denning | 33/623 |
| 4,522,489 | 6/1985 | Bouwer | 355/73 |
| 4,636,067 | 1/1987 | Richards, Sr. | 355/76 |
| 4,664,511 | 5/1987 | Carlson et al. | 355/75 |
| 4,674,191 | 6/1987 | Dougherty | 33/613 |

OTHER PUBLICATIONS

Berkey Technical Companies, date unknown, "Ideal Register Products", page unknown.
Stoesser Register Systems (date 2–86), "Pin Register Systems for the Graphic Arts", p. 9.

Primary Examiner—William A. Cuchlinski, Jr.
Assistant Examiner—Christopher W. Fulton
Attorney, Agent, or Firm—Merchant, Gould, Smith, Edell, Welter & Schmidt

[57] ABSTRACT

A board for precise and repeatable alignment and registration of plural workpieces includes a planar board member (10) with a plurality of registration pins (28,30,32) mounted thereon. The workpieces have holes in which the registration pins are received. At least one of the pins is mounted so that it can move multidirectionally within the plane of the board to maintain registration of the multiple workpieces.

15 Claims, 2 Drawing Sheets

IMAGE CONTROL BOARD

BACKGROUND OF THE INVENTION

The present invention relates broadly to the precise registration and alignment of two or more planar work pieces with respect to each other. In particular the present invention relates to an image control board used in forming images on a lithographic plate or in contacting or duping film through multiple exposures with several individual films. The importance of having each of the individual films register identically with the image created on the plate or film by repeated exposures in the series is readily apparent.

The exposure is done in a vacuum frame. The lithographic plate and films are provided with registration holes punched from the same punch hole configuration to ensure uniformity. The lithographic plate and film are placed on the image control board in the vacuum frame with the holes receiving retractable registration pins. A glass plate covers the lithographic plate and film. A rubber diaphragm in the vacuum frame draws the film and lithographic plate on the image control board against the glass plate. In the prior art this caused the registration pin to distort the area in the film around the pin hole causing the film to buckle and go out of registration. Only a few thousandths of an inch misalignment creates an unacceptable lack of registration. One solution to this problem has been the use of spring loaded retractable pins.

Also known in the prior art are image control boards formed of a rigid material, for example, Plexiglas® acrylic plastic sheets. The conventional wisdom was that the registration pins on the board must be fixed in perfect alignment. If the fixed pins are misaligned only a few thousandths of an inch the film may buckle and registration could be lost. Because the various components of a rigid image control board are made of different materials, for example steel, stainless steel, brass, aluminum and acrylic plastic, thermal expansion is a potential problem. For example, in the case of such a rigid board with fixed pins it is possible that changes in humidity or temperature will change the fixed pin alignment in a varying degree than the individual films to be used.

The present invention solves the problems of the prior art image control board systems by, at least in part, going against conventional thought in providing registration pins that float in a multidirectional fashion within the board to maintain precise and repetitive registration of the lithographic plate and film while maintaining planarity with the glass plate.

SUMMARY OF THE INVENTION

The present invention is a board that provides precise registration and alignment of a plurality of planar work pieces, each having registration holes punched therein. It is a planar board member with a plurality of registration pins mounted on the board. The planar work pieces are placed on the board with the registration holes receiving the pins. A means is provided for mounting at least one of the registration pins for multidirectional movement in the plane of the board to ensure precise registration and alignment.

In the preferred embodiment the board includes three planar board members adhered together with a plurality of pin-receiving holes that are aligned with each other and disposed in a line generally parallel to an edge of the board. Pins are received within the aligned holes. At least one pin may be fixed or all pins may be floating or mounted for multidirectional movement in the plane of the board. Because these pins will move in the plane of the board, when the lithographic plate and film are placed on the pins there will be no binding or buckling of the film at the pin holes and the lithographic plate and film will remain in precise registration. The floating pins will accommodate changes in pin alignment as a result of thermal expansion and any minor differences between the alignment of the holes punched in the plate and the film.

The novel floating pin structure of the present invention includes a barrel whose diameter is slightly smaller than the diameter of the holes in the board. A washer is fixed to the barrel. The diameter of the washer is greater than the board holes and is sandwiched between two of the planar board members. The pin is thus retained in the hole but allowed to move within the hole in any direction laterally, that is in any direction in the plane of the board. A projecting member is slidably mounted in the barrel and is spring biased toward an extended position projecting out of the barrel. When a vacuum is drawn as in the prior art the glass plate covering the lithographic plate and film forces the projecting members to retract within the barrel.

These and other advantages of the present invention will become apparent with reference to the accompanying drawings, detailed description of the preferred embodiment, and claims.

DETAILED DESCRIPTION OF THE INVENTION

Figure 3:
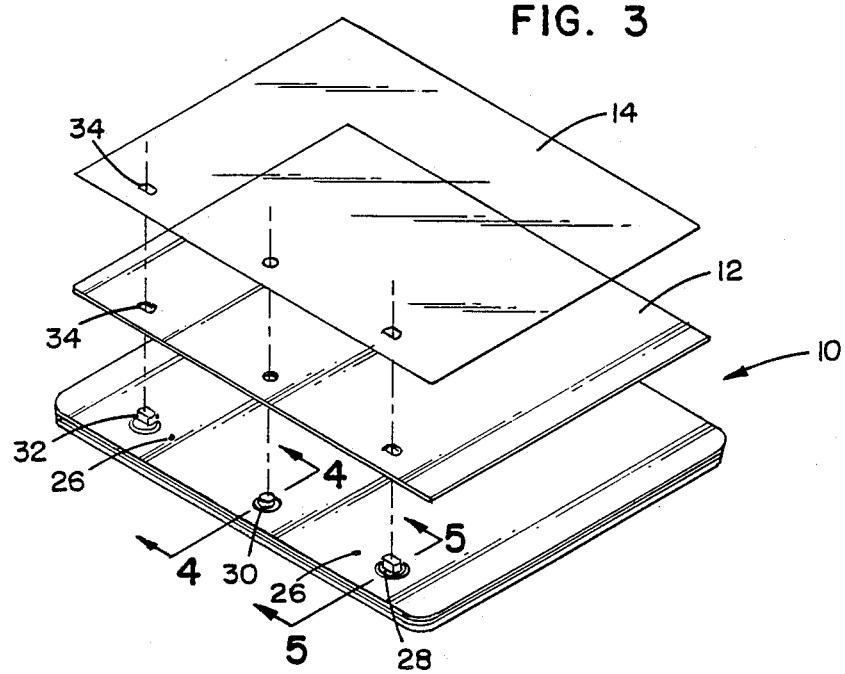
FIG. 3 is an exploded view in perspective illustrating use of the present invention.

Referring to the drawings, FIG. 3 illustrates use of an image control board 10 of the present invention. A photosensitive lithographic plate 12 is mounted on the board for exposure to multiple films, one of which is illustrated at 14, to create a multicolor image. Film 14 is placed on lithographic plate 12 and a glass plate (not shown) covers the film. Board 10 is then placed in a vacuum chamber with the board resting on a rubber diaphragm (not shown). Upon application of a vacuum within the chamber, the glass plate, film and lithographic plate are drawn tightly against board 10. The film is then exposed to generate an image on the lithographic plate or contact or dup film. In making a multicolor image or exact copy of an original piece of film, the importance of precise alignment and registration of each of a number of films is readily apparent.

Figure 1:
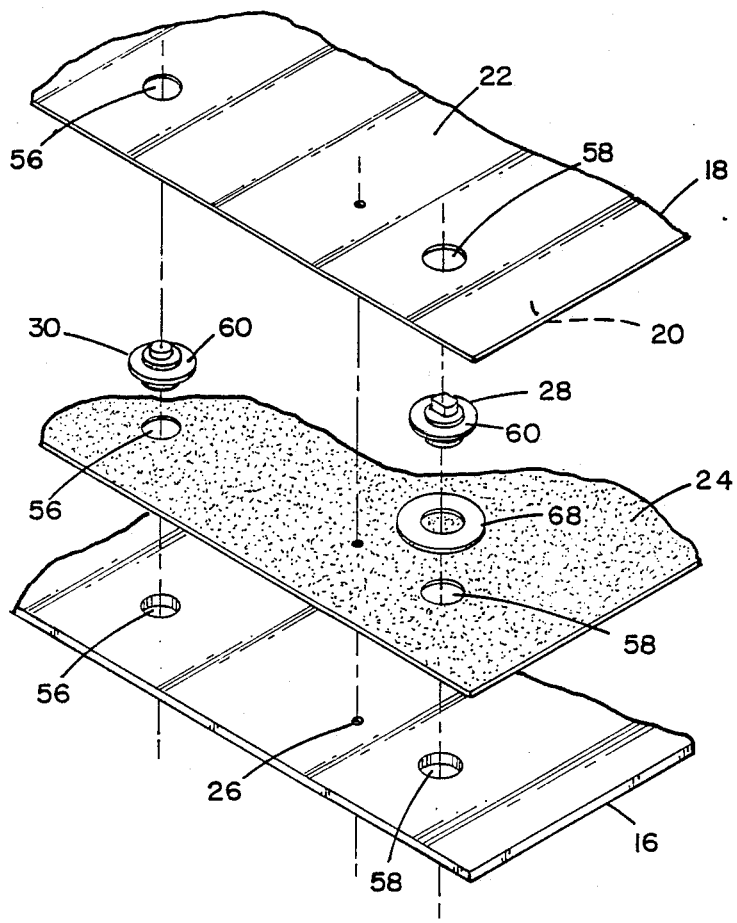
FIG. 1 is a partial exploded view in perspective of the registration board of the present invention.
Figure 2:
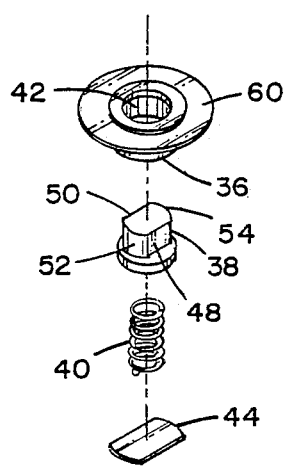
FIG. 2 is an exploded perspective view of the novel registration pin used in the board of the present invention.
Figure 4:
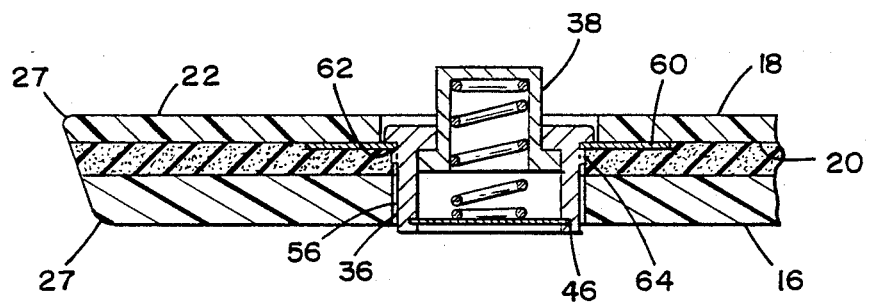
FIG. 4 is a view in cross section taken generally along the lines 4—4 of FIG. 3.
Figure 5:
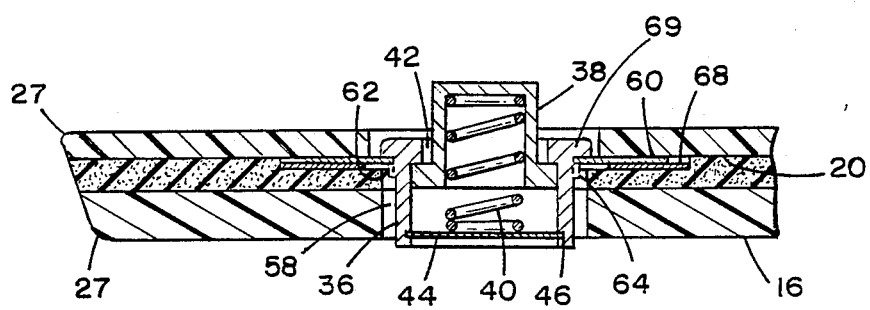
FIG. 5 is a view in cross section taken generally along lines 5—5 of FIG. 3.

Referring specifically to FIG. 1, image control board 10 includes a first planar member or base 16 made from an aerated plastic (foam) material. Base 16 is approximately 3 mm or 0.118 inches thick. Board 10 includes a second planar member or top 18 which is a polyvinylchloride (pvc) layer. The underside 20 of the top layer may be polished and its top or outer surface 22 is textured. The pvc layer is approximately 0.040 inches in thickness. The texture of outer surface 22 provides for a more efficient and quicker exhaustion of air between top layer 18 and lithographic plate 12 or film 14 upon the application of the vacuum. Also top surface 22 is black to minimize reflection in the exposure process. Sandwiched between base 16 and top layer 18 is an intermediate planar member 24 which is an open cell foam layer that is both resilient and flexible. Top layer 18, base 16 and intermediate layer 24 are laminated together by means of a suitable adhesive applied on their adjoining surfaces. Each of top 18, base 16 and intermediate layer 24 has two small holes as shown at 26 along one edge that are used for registering pins when the three components are being assembled. As shown in FIGS. 4 and 5, edges 27 are rounded so that no sharp creases will be placed in the rubber diaphragm when a vacuum is applied.

While, as stated previously, the present invention contemplates any number of pins, in the embodiment shown in the drawings for the purpose of illustration, three registration pins 28, 30, 32 are disposed along an edge of board 10 and received within holes 34 that are punched in lithographic plate 12 and exposure film 14. Pins 28, 30, 32 are spaced apart along a line generally parallel to an edge of board. Center pin 30 is fixed while means are provided for mounting the two end pins 28 and 32 so that they can move laterally. In other words, end pins 28 and 32 are allowed to move in any direction in the plane of board 10. Center pin 30 may also be mounted for lateral or multidirectional movement in the same manner as pins 28 and 32. The mounting of pins and the specific structure thereof will now be described with particular reference to FIGS. 1, 2, 4 and 5.

First, each pin includes a barrel 36 in which is slidably received a projecting member 38. Projecting member 38 is biased by a coil spring 40 to a position extending through an opening 42 in barrel 36 and projecting above top surface 22 of board 10. Spring 40 is retained within barrel 36 by a stainless steel plate 44. Stainless steel plate 44 is snapped into a groove 46 formed on the inner surface of barrel 36. Plate 44 can be removed to replace the internal parts of the pins. In a vacuum the glass plate lying on film 14 and lithographic plate 12 will force projecting members 38 into a retracted position within barrel 36 against the biasing force of coil spring 40. Projecting member 38 of center pin 30 is cylindrical while the projecting member 38 of end pins 28 and 32 has a pair of flat oppositely disposed surfaces 48 and 50 and a pair of curved oppositely disposed surfaces 52 and 54.

Holes are provided in top layer 18, intermediate layer 24, and base 16 for receiving barrel 36 of pins 28, 30 and 32. The diameter of center hole 56 is substantially the same as the diameter of barrel 36 of pin 30. On the other hand, the diameter of the end holes, one of which is shown at 58 in FIG. 1, is slightly greater than the diameter of barrel 36 of end pins 28 and 32. Barrel 36 of end pins 28, 32 has a stepped portion 62. A washer 60 is fitted to barrel 36 at the stepped portion 62 and locked into place by an annular die that stakes washer 60 between ridge portion 69 and a peripheral ridge 64. Washer 60 has a diameter that is greater than the diameter of the holes in which pins 28, 30 and 32 are mounted. Washer 36 therefore prevents the pin assemblies from falling out of the holes in board 10. In assembly a washer 68 is adhered to intermediate layer 24 about the end holes. Washer 60 on barrel 36 slides on washer 68 permitting the floating or multidirectional movement. As mentioned previously, underside 20 of top layer 18 may be polished to a smooth finish and, if so, the top surface of washer 60 will slide easily on surface 20. Washer 60 that is staked to barrel 36 of center pin 30 is adhesively fixed to intermediate layer 24 to further secure center pin 30. It should be understood that it is possible to locate center pin 30 along the edge of board 10 opposite that of pins 28 and 32.

In operation the lateral movement of end pins 28 and 32 will allow lithographic plate 12 and exposure film 14 to always align properly. Thermal expansion of board 10 caused by temperature changes poses no problem with the floating pin construction. Moreover, any minor differences between the holes that are punched in the plural workpieces, i.e., plate 12 and film 14 or multiple films will also be accommodated through the laterally floating pins. While either round or elongated pins may be used, the elongated construction, that is flat surfaces 48 and 50 and curved surfaces 52 and 54 provides the advantage of allowing some additional, if necessary, longitudinal expansion without buckling of the film. In practice, once lithographic plate 12 is placed over pins 28, 30, and 32, the pins are caused to be in perfect alignment even if plate 12 has some lateral movement. Consequently, when exposure film 14 is placed over the pins and on top of lithographic plate 12, the same alignment remains. Since the pins are in a fixed position relative to each other, film 14 cannot move with respect to lithographic plate 12 even though the film, plate, and pins might be able to move together laterally a slight amount relative to underlying board 10. While the present invention is particularly useful as an image control board for lithographic plate image formation, the floating pin concept also has application in other disciplines where precise and repeatable registration of work pieces is essential.

I claim:

1. A board providing precise registration and alignment of a plurality of planar work pieces each having a plurality of registration holes therein comprising:

a planar board member;

a plurality of pins mounted on said board and projecting from said board along a pin axis perpendicular to said board, said pins adapted to be received within the registration holes of the work pieces;

rigid mounting means for securing at least one of said pins for multidirectional movement in the plane of the board member while retaining said pin axis perpendicular to said board to ensure registration and alignment of the multiple work pieces with respect to each other.

2. A board in accordance with claim 1 wherein said planar board member further comprises first and second substantially rigid board members adhered together and having a plurality of aligned holes in which said pins are received and wherein said mounting means further comprises a washer means connected to said at least one of said pins and sandwiched between said first and second planar members for allowing movement of said pin in the plane of said board.

3. A board providing precise registration and alignment of a plurality of planar work pieces each having a plurality or registration holes therein comprising:

a planar board member;

a plurality of self-contained spring biased retractable pins mounted on said board, said pins adapted to be received within the registration holes of the work pieces;

means for mounting at least one of said pins for multidirectional movement in the plane of said board member to ensure registration and alignment of the multiple work pieces with respect to each other.

4. A board in accordance with claim 3 wherein said spring biased retractable pins comprise:
   a housing;
   a projecting member mounted for axial movement within said housing;
   spring means within said housing for biasing said projecting member toward an extended position projecting from said housing;
   means for removably mounting said projecting member within said housing.

5. A board providing precise registration and alignment of a plurality of planar work pieces each having a plurality of registration holes therein comprising:
   a first planar member;
   a second planar member adhered to said first planar member, said first and second planar members each having a plurality of aligned holes;
   a plurality of pins mounted within the aligned holes of said first and second planar members, said pins adapted to be received within the registration holes of the work pieces, at least one of said pins comprising a barrel within an aligned hole pair in said first and second planar members and having a diameter smaller than the diameter of said aligned hole pair, a washer fixed to said barrel, the diameter of said washer greater than the diameter of said aligned hole pair with said washer sandwiched between said first and second planar members;
   means for mounting said at least one of said pins for multidirectional movement in the plane of said planar board members to ensure registration and alignment of the multiple work pieces with respect to each other.

6. A board in accordance with claim 5 wherein there are a plurality of aligned hole pairs in said first and second planar members, said aligned hole pairs disposed along a line generally parallel to and proximate an edge of said planar member, and further comprising a fixed pin mounted in at least one of said aligned hole pairs and pins mounted for multidirectional movement in the plane of said board within the other of said aligned hole pairs.

7. A board in accordance with claim 5 wherein there are a plurality of aligned hole pairs in said first and second planar members, and wherein said plurality of pins are mounted within said aligned hole pairs for multidirectional movement in the plane of the board.

8. An image control board providing precise registration and alignment of a plurality of films on a lithographic plate, the plate and films having alignment holes therein, comprising:
   first and second planar members adhered together and having a plurality of holes spaced apart along a line generally parallel to an edge of said planar members;
   a first pin fixedly mounted in at least one of said holes;
   at least one pin mounted within at least one of said other of said holes and movable laterally within said hole, said at least one pin comprising a barrel having a diameter smaller than the diameter of said at least one of said other of said holes, a projecting member mounted within said barrel, spring means within said barrel for biasing said projecting member in an extended position projecting from said barrel, and a washer fixed to said barrel and having a diameter greater than the diameter of said at least one of said other of said holes, said washer sandwiched between said first and second planar members.

9. An image control board in accordance with claim 8, further comprising a washer disposed between one of said first and second planar members and said washer fixed to said barrel, and wherein said other of said first and second planar members has a smooth polished surface in contact with said washer fixed to said barrel.

10. An image control board in accordance with claim 9, further comprising a third planar member sandwiched between said first and second planar members and having a plurality of holes aligned with the holes in said first and second planar members.

11. An image control board in accordance with claim 10, wherein said first planar member is an aerated plastic, said second planar member is a polyvinylchloride layer, and said third planar member is an open cell foam material.

12. A board providing precise registration and alignment of a plurality of planar work pieces each having a plurality of registration holes therein comprising:
   first and second substantially rigid board members adhered together and having a plurality of aligned holes;
   a plurality of pins mounted on said board and received within said holes and projecting from said board members along a pin axis perpendicular to said board members, said pins adapted to be received within the registration holes of the work pieces;
   mounting means comprising a washer means connected to at least one of said pins and sandwiched between said first and second board members for allowing a multidirectional movement of said pin in the plane of said board members while retaining said pin axis perpendicular to said board members to ensure registration and alignment of the multiple work pieces with respect to each other.

13. A board in accordance with claim 12 wherein said washer means further comprises:
   a first washer affixed to said pin;
   a second washer in contact with said first washer and captured between said first washer and one of said first and second board members.

14. A floating pin adapted to be mounted on a board in a manner to permit multidirectional movement of the pin in the plane of the board comprising:
   a barrel;
   a projecting member slidably received within said barrel;
   spring means for urging said projecting member into an extended position projecting from said barrel;
   means for retaining said spring means and said projecting member in said barrel;
   a washer fixed to said barrel.

15. A floating pin in accordance with claim 14 wherein said retaining means comprises a plate removably received within a groove on the inner surface of said barrel.

* * * * *